US012566467B2

(12) United States Patent (10) Patent No.: US 12,566,467 B2
Pastorelli et al. (45) Date of Patent: Mar. 3, 2026

(54) CURRENT GENERATOR FOR IDAC FOR CORNER INDEPENDENCE

(71) Applicant: STMICROELECTRONICS INTERNATIONAL N.V., Geneva (CH)

(72) Inventors: Cedric Pastorelli, Edinburgh (GB); Steven Collins, Dalkeith (GB)

(73) Assignee: STMICROELECTRONICS INTERNATIONAL N.V., Geneva (CH)

( * ) Notice: Subject to any disclaimer, the term of this patent is extended or adjusted under 35 U.S.C. 154(b) by 89 days.

(21) Appl. No.: 18/588,989

(22) Filed: Feb. 27, 2024

(65) Prior Publication Data

US 2025/0271888 A1 Aug. 28, 2025

(51) Int. Cl.
| | |
|---|---|
| *G05F 3/26* | (2006.01) |
| *G05F 3/20* | (2006.01) |
| *G05F 3/24* | (2006.01) |
| *H03M 1/74* | (2006.01) |

(52) U.S. Cl.
CPC .............. *G05F 3/242* (2013.01); *H03M 1/74* (2013.01); *G05F 3/205* (2013.01); *G05F 3/26* (2013.01); *G05F 3/262* (2013.01)

(58) Field of Classification Search
CPC .............. G05F 3/205; G05F 3/26; G05F 3/262
See application file for complete search history.

(56) References Cited

U.S. PATENT DOCUMENTS

| | | | |
|---|---|---|---|
| 2011/0037630 A1 | 2/2011 | McLachlan et al. | |
| 2014/0097818 A1* | 4/2014 | Wiktor ................ | H02M 3/1584 |
| | | | 323/283 |
| 2016/0126838 A1 | 5/2016 | Cavallini et al. | |
| 2021/0320671 A1* | 10/2021 | Tukel ..................... | H03M 1/66 |
| 2022/0416805 A1 | 12/2022 | An et al. | |

OTHER PUBLICATIONS

Qiu et al., "A New Digital to Analog Converter Based on Low-Offset Bandgap Reference", Journal of Electrical and Computer Engineering, vol. 2017, Article ID 1658695, 10 pages, 2017. https://doi.org/10.1155/2017/1658695.

* cited by examiner

*Primary Examiner* — Gary A Nash
(74) *Attorney, Agent, or Firm* — Alston & Bird LLP

(57) ABSTRACT

Apparatuses, systems, and methods for improved current generators for IDAC corner independence are provided. An exemplary apparatus may include current generator circuitry and a IDAC. The current generator circuitry is configured to generate a reference current. The IDAC is configured to generate an IDAC current based at least on the reference current. The current generator circuitry may adjust or update the reference current based on a change in temperature and/or process. This results in an adjustment or update in the IDAC current.

20 Claims, 6 Drawing Sheets

CURRENT GENERATOR FOR IDAC FOR CORNER INDEPENDENCE

TECHNOLOGICAL FIELD

Example embodiments of the present disclosure relate generally to a current generator for a current digital-to-analog converter (IDAC), particular to systems, apparatuses, and methods for a current generator for IDAC corner independence.

BACKGROUND

A current digital-to-analog converter (IDAC) may source or sink a current that may be output. The output of IDACs may, however, be corner dependent. For example, the output may vary due to variations in temperature or process.

The inventors have identified numerous areas of improvement in the existing technologies and processes, which are the subjects of embodiments described herein. Through applied effort, ingenuity, and innovation, many of these deficiencies, challenges, and problems have been solved by developing solutions that are included in embodiments of the present disclosure, some examples of which are described in detail herein.

BRIEF SUMMARY

Various embodiments described herein relate to current generators for IDACs.

In accordance with some embodiments of the present disclosure, an example apparatus is provided. The apparatus may comprise: a current generator circuitry comprising: an op amp comprising a first input, a second input, and an output, wherein the first input is electrically connected to a reference voltage; a first FET comprising a first drain, a first gate, and a first source, wherein the first gate is connected to the output of the op amp; a resistor comprising a first terminal and a second terminal, wherein the first terminal is electrical connected to the first source and to the second input of the op amp, and wherein the second terminal is electrically connected to a ground; a voltage supply; a second FET comprising a second drain, a second gate, and a second source, wherein the second drain is electrically connected to a voltage source; a third FET comprising a third drain, a third gate, and a third source, wherein the third drain is electrically connected to the voltage source, and wherein the third gate is electrically connected to the second gate, the second source, and to the first drain; an output terminal of the current generator circuit, wherein the output terminal of the current generator circuit is electrically connected to the third source; and an IDAC electrically connected to the output terminal of the current generator circuitry.

In some embodiments, the IDAC is configured to generate an IDAC current based at least on a reference current generated by the current generator circuitry.

In some embodiments, the current generator circuitry is configured to generate the reference current based on the resistor, and wherein a change in the resistance of the resistor based on a change in temperature is associated with a change in the reference current.

In some embodiments, the IDAC is further configured to generate the IDAC current based on a selection signal comprising a plurality of bits.

In some embodiments, the plurality of bits comprises 8 bits, and wherein the 8 bits specify to the IDAC a number of current increments to implement in the IDAC current.

In some embodiments, the apparatus further comprises PWM circuitry configured to generate a driver signal based at least on the IDAC current.

In some embodiments, the apparatus further comprises a SPAD array configured to be driven based at least on the driver signal.

In some embodiments, the second FET and the third FET are PMOSFETs.

In some embodiments, the first FET is an NMOSFET.

In some embodiments, the apparatus is one of a mobile phone, laptop, or augmented reality device.

In accordance with some embodiments of the present disclosure, an example method is provided. The method may comprise: generating a first reference current with a current generator circuitry, wherein the current generator circuitry comprises: an op amp comprising a first input, a second input, and an output, wherein the first input is electrically connected to a reference voltage; a first FET comprising a first drain, a first gate, and a first source, wherein the first gate is connected to the output of the op amp; a resistor comprising a first terminal and a second terminal, wherein the first terminal is electrical connected to the first source and to the second input of the op amp, and wherein the second terminal is electrically connected to a ground; a voltage supply; a second FET comprising a second drain, a second gate, and a second source, wherein the second drain is electrically connected to a voltage source; a third FET comprising a third drain, a third gate, and a third source, wherein the third drain is electrically connected to the voltage source, and wherein the third gate is electrically connected to the second gate, the second source, and to the first drain; an output terminal of the current generator circuit, wherein the output terminal of the current generator circuit is electrically connected to the third source; generating a first IDAC current with an IDAC at a first time based on the first reference current, wherein the IDAC is electrically connected to the output terminal of the current generator circuitry; generating an adjusted reference current with the current generator circuitry at a second time based on a change in temperature; generating an adjusted IDAC current with the IDAC at a second time based on the adjusted reference current.

In some embodiments, generating the first reference current is based on the resistor, and wherein generating the adjusted reference current is based on a change in temperature associated with a change in the reference current.

In some embodiments, generating the first IDAC current is based on a selection signal comprising a plurality of bits, and wherein generating the adjusted IDAC current is based on the selection signal.

In some embodiments, the plurality of bits comprises 8 bits, and wherein the 8 bits specify to the IDAC a plurality of current increments to implement in the IDAC current.

In some embodiments, each voltage increment of the plurality of increments is associated with a linear current change.

In some embodiments, the method further comprises generating a driver signal with a PWM circuitry based at least on the IDAC current.

In some embodiments, the method further comprises driving a SPAD array with the driver signal.

In some embodiments, wherein the second FET and the third FET are PMOSFETs.

In some embodiments, the first FET is an NMOSFET.

In some embodiments, the current generator circuitry and the IDAC are in one of a mobile phone, laptop, or augmented reality device.

The above summary is provided merely for purposes of summarizing some example embodiments to provide a basic understanding of some aspects of the disclosure. Accordingly, it will be appreciated that the above-described embodiments are merely examples and should not be construed to narrow the scope or spirit of the disclosure in any way. It will also be appreciated that the scope of the disclosure encompasses many potential embodiments in addition to those here summarized, some of which will be further described below.

BRIEF SUMMARY OF THE DRAWINGS

Figure 1:
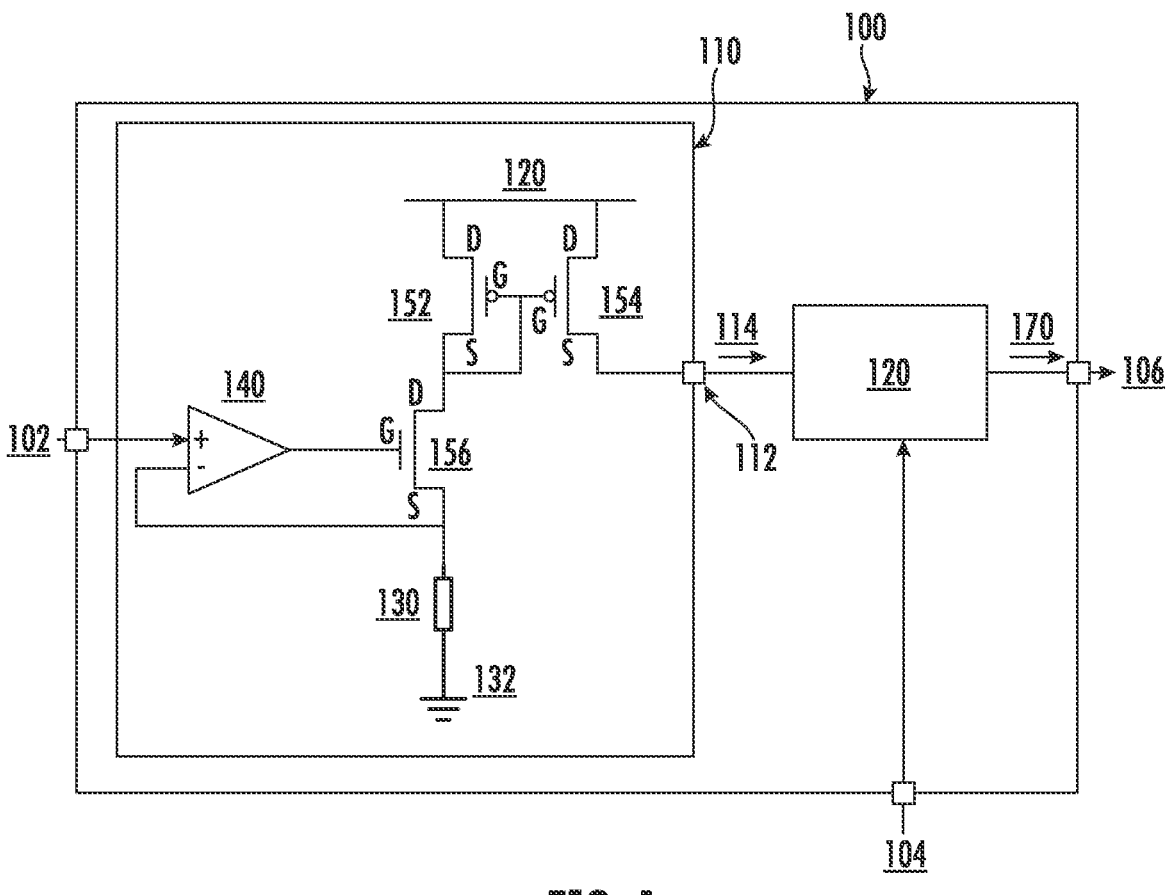
Figure 2:
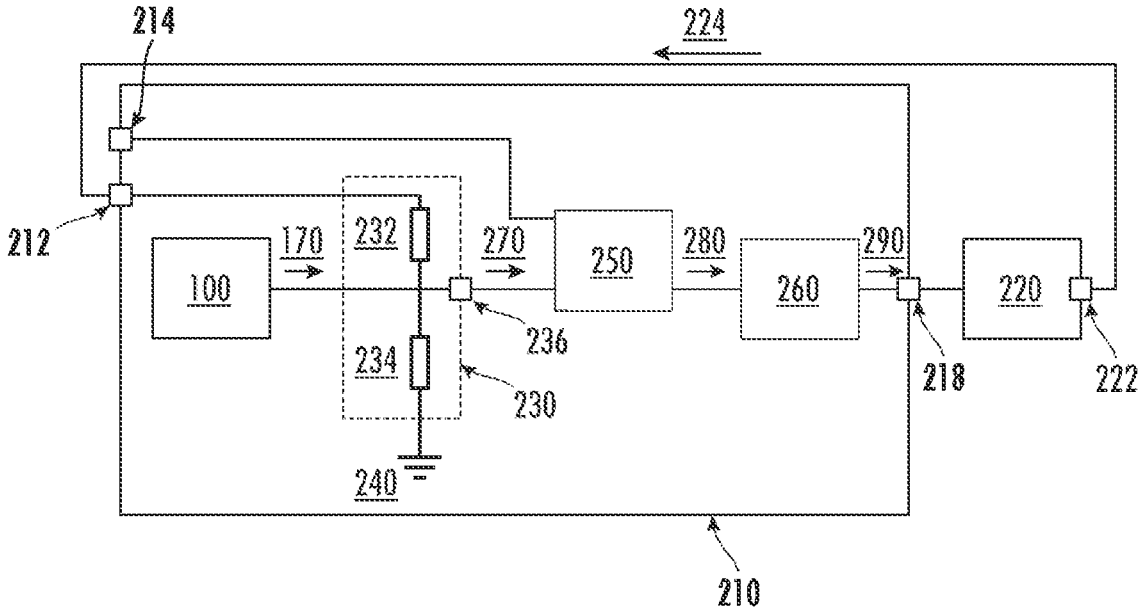
Figure 3:
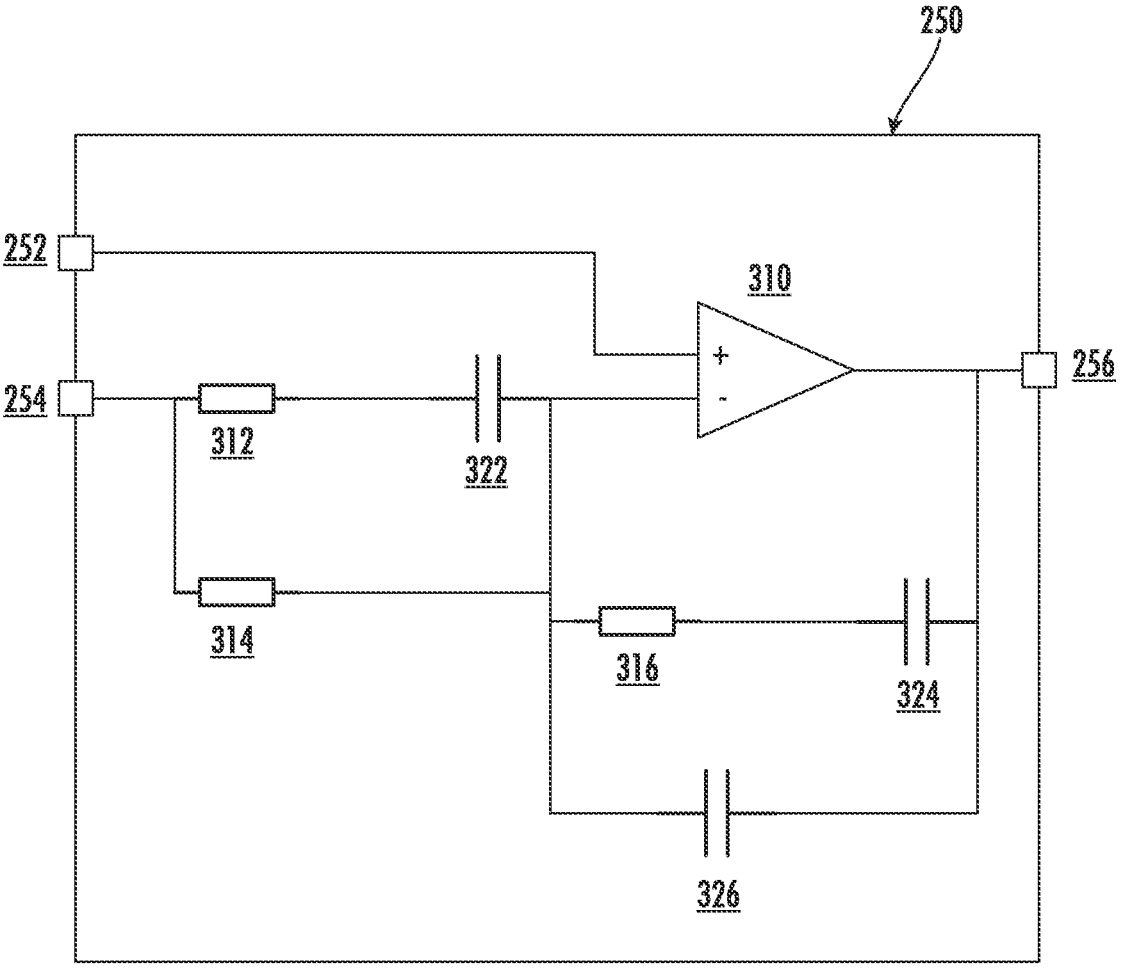
Figure 4:
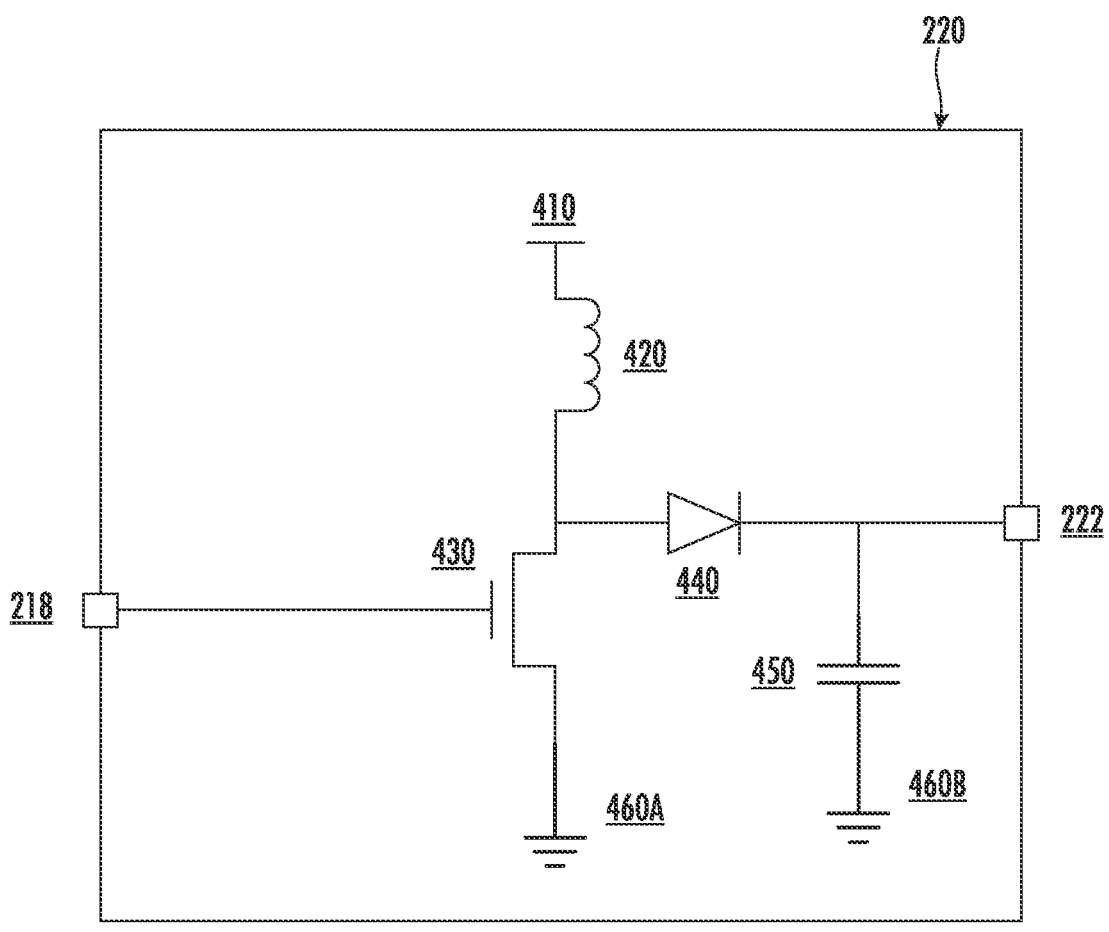
Figure 5:
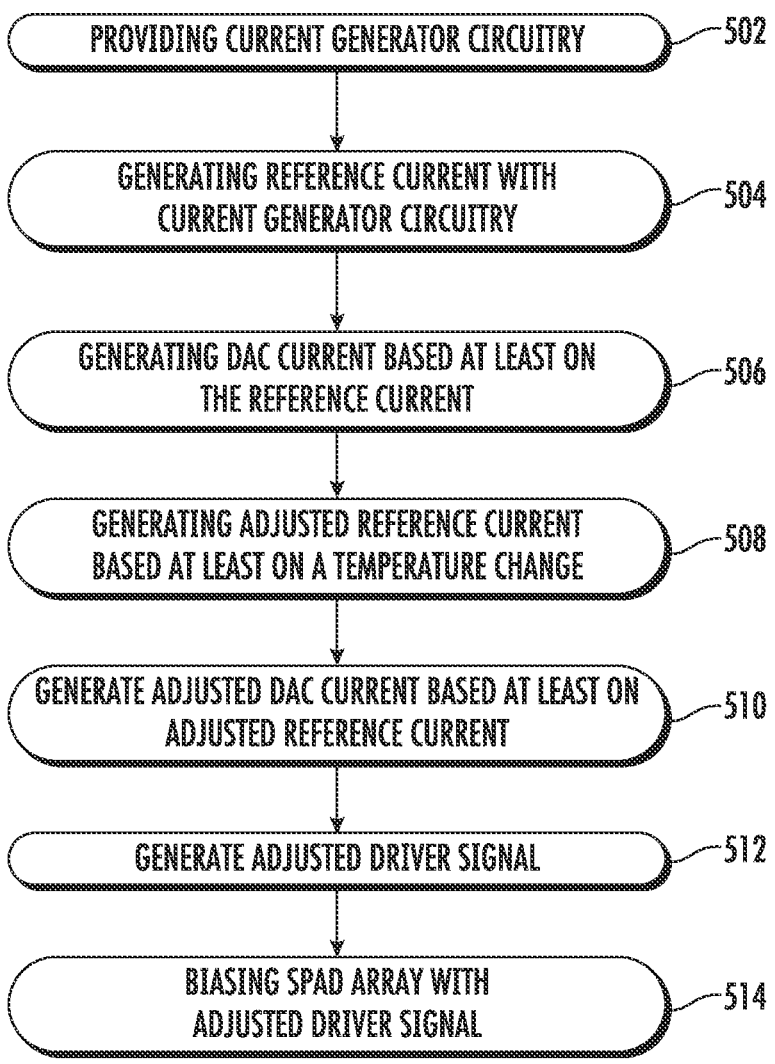
Figure 6:
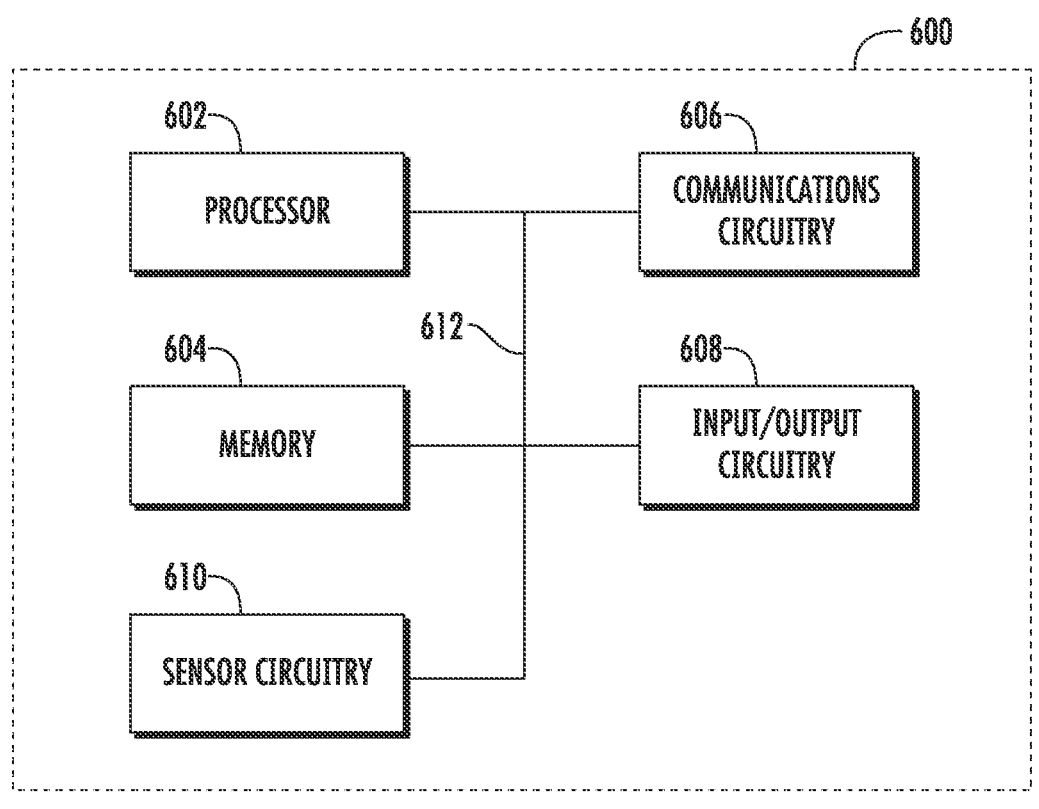

Having thus described certain example embodiments of the present disclosure in general terms, reference will now be made to the accompanying drawings, which are not necessarily drawn to scale, and wherein:

FIG. 1 illustrates an example circuit diagram associated with IDAC circuitry in accordance with one or more embodiments of the present disclosure;

FIG. 2 illustrates an example circuit diagram associated with driver circuitry in accordance with one or more embodiments of the present disclosure;

FIG. 3 illustrates an example circuit diagram associated with error circuitry in accordance with one or more embodiments of the present disclosure;

FIG. 4 illustrates an example circuit diagram associated with driver output circuitry in accordance with one or more embodiments of the present disclosure;

FIG. 5 illustrates an example diagram associated with operations for operating an exemplary system and/or apparatus in accordance with one or more embodiments of the present disclosure; and FIG. 6 illustrates an example block diagram of a device in accordance with one or more embodiments of the present disclosure.

DETAILED DESCRIPTION

Some embodiments of the present disclosure will now be described more fully herein with reference to the accompanying drawings, in which some, but not all, embodiments of the disclosure are shown. Indeed, various embodiments of the disclosure may be embodied in many different forms and should not be construed as limited to the embodiments set forth herein; rather, these embodiments are provided so that this disclosure will satisfy applicable legal requirements. Like reference numerals refer to like elements throughout.

As used herein, the term "comprising" means including but not limited to and should be interpreted in the manner it is typically used in the patent context. Use of broader terms such as comprises, includes, and having should be understood to provide support for narrower terms such as consisting of, consisting essentially of, and comprised substantially of.

The phrases "in various embodiments," "in one embodiment," "according to one embodiment," "in some embodiments," and the like generally mean that the particular feature, structure, or characteristic following the phrase may be included in at least one embodiment of the present disclosure and may be included in more than one embodiment of the present disclosure (importantly, such phrases do not necessarily refer to the same embodiment).

The word "example" or "exemplary" is used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that a specific component or feature is not required to be included or to have the characteristic. Such a component or feature may be optionally included in some embodiments or it may be excluded.

The use of the term "circuitry" as used herein with respect to components of a system or an apparatus should be understood to include particular hardware configured to perform the functions associated with the particular circuitry as described herein. The term "circuitry" should be understood broadly to include hardware and, in some embodiments, software for configuring the hardware. For example, in some embodiments, "circuitry" may include processing circuitry, communications circuitry, input/output circuitry, and the like. In some embodiments, other elements may provide or supplement the functionality of particular circuitry.

Overview

Various embodiments of the present disclosure are directed to improved current generators for IDAC corner independence. For example, in various embodiments the current generator makes a reference current temperature and corner dependent so that an IDAC generates a voltage independent of corners and temperature.

A current digital-to-analog converter (IDAC) may generate a current output and/or voltage output that is based on at least an input reference signal (e.g., reference current or reference voltage) and a select signal. A reference current may also be described as a bias current. The select signal may be a plurality of bits, which may be referred to as a codeword or word. In various embodiments, the select signal may be 8 bits that are provided to the IDAC. In various embodiments the select signal may be fewer than 8 bits or greater than 8 bits. The IDAC may generate an output that changes in voltage and/or current based on the select signal. For example, if an IDAC's voltage output range is from 16 to 25V, an 8 bit select signal may be used to determine how the output voltage is incremented by stepping up the voltage by a plurality of steps. A step may shift the output voltage from a low voltage value (e.g., 16V) to a high voltage value (e.g., 26V) at regular step intervals (e.g., 50 mV). Similarly, a current output may be incremented based on a select signal. Of the bits of the select signal, a least significant bit (LSB) determines the last step to be implemented by the IDAC and, thus, the output voltage and/or current. However, the IDAC out may also move due to corner dependencies of process and/or temperature. Changes in process and/or temperature result a variation of the IDAC output voltage. For example, a temperature variation may have a voltage variation of 1.2 to 2 mV in the output of the IDAC per degree C. variation. Embodiments of the present disclosure compensate for such variations in voltage. Additionally or alternatively, process corner variations include manufacturing corners to be compensated for. As described herein, the present disclosure compensates for process corners in conjunction with temperature variations. Such compensations provide, among other things, improvements by omitting the requirement of performing one or more trim processes (e.g., additional bias operations) to set the voltage increments per IDAC code to compensate for manufacturing corners. Thus the circuitry of the present disclosure may allow for and control the feedback of an application in a linear manner.

An IDAC is one component of an apparatus and/or system. The current generator circuitry and the IDAC circuitry may be referred to as a boost controller circuit or a part of a boost controller circuit. In various embodiments of the present disclosure, a high voltage value of an IDAC may be determined as a product of a reference current to the IDAC and a resistance value of a current generator circuitry. In various embodiments, the IDAC output of an IDAC current may be provided to a current divider to generate a specific voltage for a divided voltage signal. The divided voltage signal may then be input into additional circuitry depending on the application.

For example, embodiments of the present disclosure include the divided voltage signal input to additional circuitry that includes PWM circuitry and a driver to generate an output signal that may be used by or used to drive a single-photon avalanche diode (SPAD) array. Various embodiments of such circuitry are part of laptop, mobile phones, mobile devices configured for, among other things, augmented reality, and the like that may use SPAD arrays in time-of-flight (ToF) sensors to generate a light signal that is received to determine a distance by the ToF sensor. Alternatively or additionally, the SPAD arrays may be use for LIDAR functionality. These sensors benefit from the voltage generator circuitry output compensating for temperature and/or process that allows for linear outputs to the IDAC circuitry and subsequent circuitry to improve reliability and efficiency in operations. For example, the breakdown voltage of a SPAD varies with temperature. Temperature changes may be monitored with a temperature sensor. Various embodiments may also compensate the output of the IDAC circuitry through control of the voltage divider circuitry based on a temperature sensor signal turning on and/or off switches to reconfigure the resistance(s) of the voltage divider circuitry, which allows for dynamic compensation of the boost controller circuit.

Various embodiments herein may include a boost controller circuit with a voltage output that ranges between a high voltage (e.g., 25V) and a low voltage (e.g., 0V or 15V). The high voltage may be set with resistor circuitry described herein. The resistor circuitry may allow for tuning to provide more or less current. With the embodiments of the IDAC described herein, this tuning may compensate for temperature and/or process variations.

Exemplary Systems, Apparatuses, and Methods

Embodiments of the present disclosure herein include systems, apparatuses, and methods for current generator for an IDAC described herein may be implemented in various embodiments.

FIG. 1 illustrates an example circuit diagram associated with IDAC circuitry in accordance with one or more embodiments of the present disclosure. FIG. 1 illustrates an IDAC circuitry 100, which may include a current generator circuitry 110. While current generator circuitry 110 is illustrated in IDAC circuitry 100, the current generator circuitry 110 may be located external to the IDAC circuitry 100.

The IDAC circuitry 100 may receive a reference voltage at a first IDAC circuitry input terminal 102, receive a selection signal at the second IDAC circuitry input terminal 104, and may output an IDAC current 170 at IDAC circuitry output terminal 106.

The current generator circuitry 110 may generate a reference current 114 based on the reference voltage, which may provide to the current generator circuitry via the second IDAC circuitry input terminal 104. In various embodiments, the reference current 114 may be provided to a current generator circuitry output terminal 112. The IDAC 120 may be electrically connected to the current generator circuitry output terminal 112 to receive the reference current 114 as an input to the IDAC 120.

The IDAC 120 may generate the IDAC current 170 based at least on the reference current 114 and the selection signal. The selection signal may be comprised of a plurality of bits. In various embodiments, an 8-bit selection signal may be used. The 8 bits of the selection signal may specify how many of a plurality of increments or steps to increment a current and/or a voltage by in the IDAC 120. Thus the IDAC 120 may generate the IDAC current 170. In various embodiments, a change in increment may increase the current and/or voltage linearly. Alternatively or additionally, a change in increment may increase the current and/or voltage non-linearly.

The current generator circuitry 110 may include a plurality of electrical components. For example, the current generator circuitry 110 may include one or more electrical connections to a voltage rail 120, which may also be referred to as a voltage source. The voltage rail 120 is electrically connected to a first FET 152 and a second FET 154.

The first FET 152 may be a PMOSFET with a drain, gate, and source. The first FET 152 may be electrically connected to the voltage rail 120 at the drain of the first FET 152.

The second FET 154 may be a PMOSFET with a drain, gate, and source. The second FET 154 may be electrically connected to the voltage rail 120 at the drain of the second FET 154. The source of the second FET 154 may be electrically connected to the current generator circuitry output terminal 112, which may be where the reference current 114 is output.

The gate of the first FET 152 and the gate of the second FET 154 may be electrically connected to each other, to the source of the first FET 152, and to a drain of a third FET 156.

The third FET 156 may be an NMOSFET with a drain, gate, and source. The gate of the third FET 156 may be electrically connected to the output of an op amp 140. A first input (e.g., + terminal) of the op amp 140 may be electrically connected to the first IDAC circuitry input terminal 102 to receive a voltage. The source of the third FET 156 may be electrically connected to a second input (e.g., − terminal) of the op amp 140 as well as a first terminal of a resistor 130. The resistor 130, at a second terminal, may be electrically connected to a ground 132. It will be appreciated that while a first FET 152, a second FET 154, and a third FET 156 are illustrated in FIG. 1, various embodiments may include more than 3 FETS. For example, various embodiments may include additional FETs such that the current mirrors of the first FET 152 and the second FET 154 are cascaded with the additional FETs.

In operation, the resistor 130 varies with temperature and/or process. The variation in the resistor 130 causes a variation in the reference current 114. The variation in resistor 130 causes a change in the current into resistor 130. The voltage at the first terminal of resistor 130 remains constant. The op amp 140 and the third FET 156 cause the voltage across resistor 130 to the voltage on first IDAC circuitry input terminal 102. The current varies inversely with the resistance of resistor 130. This results in a change with the variations to the current to the first FET 152 and second FET 154 from the voltage rail 120. This then changes reference current 114 to the IDAC 120, which will change the IDAC current 170.

The variation in the reference current 114 provides a variation or modulation in an input to the IDAC 120. This variation along with the processing of the LSB of the selection signal generates an IDAC current 170. A variation in the resistance of resistor 130, such as based on variations in temperature and/or process, results in a variation of the IDAC current 170.

For example, a variation of temperature and/or process may cause a variation in the reference current 114 that compensates for a plus or minus variation 80 μA in the reference current 114. As voltage is related to current and the resistance, and as the voltage at the first terminal of resistor 130 is caused to be the voltage at the first IDAC circuitry input terminal 102, the variation in the resistance varies the IDAC current 170 from the IDAC 120. In various embodiments, when. In various embodiments, the voltage at the first IDAC circuitry input terminal 102 may be referred to as a bandgap voltage. When the IDAC current 170 is provided to a matching resistor, the voltage will not change with corners.

FIG. 2 illustrates an example circuit diagram associated with driver circuitry in accordance with one or more embodiments of the present disclosure. The driver circuitry 210 may include, among other things, the IDAC circuitry 100. The IDAC current 170 of the IDAC circuitry 100, which is varied or compensated with temperature and/or process variations, may be used by the driver circuitry 210 to generate a driver signal 290 that may be provided to a driver circuitry output terminal 218. A driver output circuitry 220 may be electrically connected to the driver circuitry output terminal 218 and may control the application of the driver signal 290 to, for example, a SPAD array (not illustrated) that may be electrically connected to an output terminal 222. Thus the driver signal 290 may be used to drive the SPAD array, such as in ToF applications, augmented reality applications, and the like. The output terminal 222 may also be electrically connected to a driver circuitry input terminal 212 to provide a feedback signal 224. The feedback signal 224 may be a voltage signal that may be used by the driver circuitry 210 in generating the driver signal 290.

While the driver output circuitry 220 is illustrated separate from the driver circuitry 210, it will be appreciated the driver output circuitry 220 may be located in or adjacent to the driver circuitry 210.

The driver circuitry 210 may include, among other things, resistor circuitry 230, error circuitry 250, and PWM circuitry 260. The driver circuitry 210 may include a plurality of input terminals (e.g., 212, 214) and one or more output terminal (e.g., 218).

The resistor circuitry 230 may include a plurality of resistors, including a first or top resistor 232, a second or bottom resistor 234, and a ground 240. It will be appreciated that each of the first resistor 232 and also the second resistor 234 may be comprised of, among other things, two or more resistors in a plurality of configurations.

The first resistor 232 may include a first terminal and a second terminal. The second resistor 234 may also include a first terminal and a second terminal.

The first terminal of the first resistor 232 may be electrically connected to the driver circuitry input terminal 212 to receive the feedback signal 224. The second terminal of the second resistor 232 may be electrically connected to the first terminal of the second resistor 234, to the IDAC circuitry output terminal 106 to receive the IDAC current 170, to the resistor circuitry output terminal 236 to provide the divided voltage signal 270. The second terminal of the second resistor 234 may be electrically connected to a ground 240.

The divided voltage signal 270 may be determine based on the feedback signal 224, the IDAC current 170, and the ratio of resistances of the first resistor 232 and the second resistor 234 of the resistance circuitry 230. The IDAC current 170 from the IDAC 120 will bias the second resistor 234. With the feedback loop into the op amp 140, the IDAC current 170 will pull the input nodes of the op amp 140 equal to a reference voltage (e.g., 0.9 V). This causes the temperature and/or process variations in the voltage divider circuitry 230 to be cancelled by the resistance ratio.

The resistance of the first resistor 232 and of the second resistor 234 may be chosen to be multiples of resistor 130. For example, the multiple M1 may be a multiple of the resistance of resistor 130 that is the resistance of the first resistor 232. The multiple M2 may be a multiple of the resistance of resistor 130 that is the resistance of the second resistor 234. As such, the following equations provide for values of certain voltages.

$$VFB = VREF\_ERR + R1*(I2 - IDAC)$$

$$VFB = VREF\_ERR*(1 + R1/R2) - N*R1/R*VREF\_IDAC$$

Setting VREF_ERR equal to VREF_IDAC may allow for both to be written as VREF, which allows for VFB to be:

$$VFB = VREF*(1 + R1/R2 - N*R1/R)$$

VFB=feedback voltage 224 (which is also the output voltage at terminal 222)

VREF_ERR=a first reference voltage, such as input at driver circuitry input terminal 214

VREF_IDAC=a second reference voltage, such as input at IDAC circuitry input terminal 102

IDAC=reference current 170

I2=current through resistor R2

R=resistance of resistor 130

R1=M1*R=resistance of resistor 232

R2=M2*R=resistance of resistor 234

N=IDAC settings from selection signal

For example, a first configuration of the resistor circuitry 230 may include a voltage ladder with a plurality of resistors and selection switches or taps. The selection switches may be used to open or close electrically connections to the plurality of resistors to vary the voltage and/or current that may be provided at the resistor circuitry output terminal 236 for the divided voltage signal 270. In various embodiments the selection switches and/or taps may be open or closed to select a voltage based on a control signal received, which may be based on a temperature measurement from one or more temperature sensors. In such embodiments the voltage may be varied according to, among other things, temperature measurements.

The divided voltage signal 270 may be provided to the error circuitry 250 to generate an error voltage 280. The error circuitry 250 is described further herein.

The error voltage 280 is provided to the PWM circuitry 260. The PWM circuitry 260 may include a PWM modulator, a pulse, and one or more drivers. The PWM modulator may use a clock signal and the error voltage 280 to generate a PWM signal 290. The PWM signal may be a shaped signal. The PWM signal 290 may be provided to a pulse shaper to shape one or more pulses to provide to one or more drivers. The one FIG. 3 illustrates an example circuit diagram associated with error circuitry in accordance with one or more embodiments of the present disclosure. The error circuitry 250 may include an op amp 310, a plurality of resistors (e.g., 312, 314, and 316, and plurality of resistors (e.g., 322, 324, and 326). The error circuitry 250 may include a first input terminal 252, a second input terminal 254, and an output terminal 256. The first input terminal 252 may be electrically connected to other circuitry (e.g., driver circuitry input terminal 214) to provide a reference voltage to the op amp 310. The second input terminal 254 may be electrically connected to resistor circuitry output terminal 236 to provide the divided voltage signal 270 the plurality of resistors, plurality of capacitors, and then the op amp 310. The output terminal 256 may provide the error voltage 280 to additional circuitry (e.g., PWM circuitry 260). It will be appreciated that the error circuitry may include more or less electrical components than illustrated in FIG. 3.

FIG. 4 illustrates an example circuit diagram associated with driver output circuitry in accordance with one or more embodiments of the present disclosure. The driver output circuitry 220 may include a voltage rail 410, which may be a voltage source. It may also include a FET 430, a diode 440, a capacitor 450, and a plurality of grounds 460A, 460B. The plurality of grounds may also be a single ground. The driver output circuitry 220 may include an input terminal 218 to receive a driver signal 290 and an output terminal 222. The feedback signal 224 may be electrically connected to the output terminal 222. In various embodiments, the output terminal 222 may be electrically connected to one or more additional circuitries, such as to a SPAD array. The driver output circuitry 220 operate as a gate to control the transmission of the driver signal 290 from the input terminal 218 to the output terminal 222.

FIG. 5 illustrates an example diagram associated with operations for operating an exemplary system and/or apparatus in accordance with one or more embodiments of the present disclosure.

At operation 502, providing current generator circuitry, such as described herein. Additionally, the current generator circuitry 110 may be provided with additional circuitry described herein.

At operation 504, generating reference current with current generator circuitry. The current generator circuitry 110 may be used to generate a reference current 114.

At operation 506, generating IDAC current based at least on the reference current. The IDAC 120 may be used to generate an IDAC current 170 based at least on the reference current 114. For example, the IDAC 120 may also use a selection signal to generate the IDAC current 170.

At operation 508, generating adjusted reference current based at least on a temperature change. A variation in temperature from time 1 to time 2 may lead to a temperature change. The resistor 130 of the current generator circuitry 110 may varies with the change in temperature. This may, as described herein, generate a reference current 114 that varies from the reference current 114 generated at time 1. The reference current 114 at time 2 that includes the variation may be referred to as an adjusted reference current.

At operation 510, generate adjusted IDAC current based at least on adjusted reference current. With the adjusted reference current, the IDAC 120 may generate an adjusted IDAC current at time 2.

At operation 512, generate an adjusted driver signal. Various embodiments may include PWM circuitry 260 that may be used to generate a driver signal 290. The variation of the IDAC current 170 may be associated with a variation in the driver signal 290. At a first time the PWM circuitry 260 may generate a first driver signal 290 and at time 2, after a variation in temperature, the PWM circuitry 260 may generate an adjusted driver signal 290 that varies based at least on the adjusted reference current generated by the current generator circuitry 110.

At operation 514, biasing SPAD array with adjusted driver signal. In various embodiments the driver signal 290 may be provided to a SPAD array. For example, the driver signal 290 may be transmitted through driver output circuitry 220 and a SPAD array may be electrically connected to output terminal 222. The driver signal 290 may be adjusted based on the variation in temperature and then the adjusted driver signal 290 may be provided to the SPAD array for use in application, including but not limited to applications described herein.

FIG. 6 illustrates an example block diagram of a device in accordance with one or more embodiments of the present disclosure. Exemplary embodiments of the device 600 may include, for example, mobile phone, laptop, augmented reality device, etc. The device 600 illustrated includes a processor 602, memory 604, communications circuitry 606, and input/output circuitry 608, and sensor circuitry 610, which may all be connected via a bus 612.

The processor 602, although illustrated as a single block, may be comprised of a plurality of components and/or processor circuitry. The processor 602 may be implemented as, for example, various components comprising one or a plurality of microprocessors with accompanying digital signal processors; one or a plurality of processors without accompanying digital signal processors; one or a plurality of coprocessors; one or a plurality of multi-core processors; processing circuits; and various other processing elements. The processor may include integrated circuits, such as ASICs, FPGAs, systems-on-a-chip (SoC), or combinations thereof. In various embodiments, the processor 602 may be configured to execute applications, instructions, and/or programs stored in the processor 602, memory 604, or otherwise accessible to the processor 602. When executed by the processor 602, these applications, instructions, and/or programs may enable the execution of one or a plurality of the operations and/or functions described herein. Regardless of whether it is configured by hardware, firmware/software methods, or a combination thereof, the processor 602 may comprise entities capable of executing operations and/or functions according to the embodiments of the present disclosure when correspondingly configured.

The memory 604 may comprise, for example, a volatile memory, a non-volatile memory, or a certain combination thereof. Although illustrated as a single block, the memory 604 may comprise a plurality of memory components. In various embodiments, the memory 604 may comprise, for example, a random access memory, a cache memory, a flash memory, a hard disk, a circuit configured to store information, or a combination thereof. The memory 604 may be configured to write or store data, information, application programs, instructions, etc. so that the processor 602 may execute various operations and/or functions according to the embodiments of the present disclosure. For example, in at least some embodiments, a memory 604 may be configured to buffer or cache data for processing by the processor 602. Additionally or alternatively, in at least some embodiments, the memory 604 may be configured to store program instructions for execution by the processor 602. The memory 604 may store information in the form of static and/or dynamic information. When the operations and/or functions are executed, the stored information may be stored and/or used by the processor 602.

The communication circuitry 606 may be implemented as a circuit, hardware, computer program product, or a combination thereof, which is configured to receive and/or transmit data from/to another component or apparatus. The computer program product may comprise computer-readable program instructions stored on a computer-readable medium (e.g., memory 604) and executed by a processor 602. In various embodiments, the communication circuitry 606 (as with other components discussed herein) may be at least partially implemented as part of the processor 602 or otherwise controlled by the processor 602. The communication circuitry 606 may communicate with the processor 602, for example, through a bus 612. Such a bus 612 may connect to the processor 602, and it may also connect to one or more other components of the processor 602. The communication circuitry 606 may be comprised of, for example, transmitters, receivers, transceivers, network interface cards and/or supporting hardware and/or firmware/software, and may be used for establishing communication with another component(s), apparatus(es), and/or system(s). The communication circuitry 606 may be configured to receive and/or transmit data that may be stored by, for example, the memory 604 by using one or more protocols that can be used for communication between components, apparatuses, and/or systems.

In various embodiments, the communication circuitry 606 may convert, transform, and/or package data into data packets and/or data objects to be transmitted and/or convert, transform, and/or unpackage data received, such as from a first protocol to a second protocol, from a first data type to a second data type, from an analog signal to a digital signal, from a digital signal to an analog signal, or the like. The communication circuitry 606 may additionally, or alternatively, communicate with the processor 602, the memory 604, the input/output circuitry 608, and/or the sensor circuitry 610, such as through a bus 612.

The input/output circuitry 608 may communicate with the processor 602 to receive instructions input by an operator and/or to provide audible, visual, mechanical, or other outputs to an operator. The input/output circuitry 608 may comprise supporting devices, such as a keyboard, a mouse, a user interface, a display, a touch screen display, lights (e.g., warning lights), indicators, speakers, and/or other input/output mechanisms. The input/output circuitry 608 may comprise one or more interfaces to which supporting devices may be connected. In various embodiments, aspects of the input/output circuitry 608 may be implemented on a device used by the operator to communicate with the processor 602. The input/output circuitry 608 may communicate with the memory 604, the communication circuitry 606, the sensor circuitry 610, and/or any other component, for example, through a bus 612.

The sensor circuitry 610 may include the driver circuitry 210 and driver output circuitry 220 as well as sensors (e.g., a SPAD array, etc.). The sensor circuitry 610 may be implemented as circuitry described herein as well as additional hardware, computer program products, or a combination thereof, which is configured to perform one or more operations and/or function, such as those described herein.

It should be readily appreciated that the embodiments of the systems, apparatuses, and methods and related systems and apparatuses described herein may be configured in various additional and alternative manners in addition to those expressly described herein. For example an operation may include additional operations and/or omit one or more operations described herein.

CONCLUSION

Operations and/or functions of the present disclosure have been described herein, such as in flowcharts. As will be appreciated, computer program instructions may be loaded onto a computer or other programmable apparatus (e.g., hardware) to produce a machine, such that the resulting computer or other programmable apparatus implements the operations and/or functions described in the flowchart blocks herein. These computer program instructions may also be stored in a computer-readable memory that may direct a computer, processor, or other programmable apparatus to operate and/or function in a particular manner, such that the instructions stored in the computer-readable memory produce an article of manufacture, the execution of which implements the operations and/or functions described in the flowchart blocks. The computer program instructions may also be loaded onto a computer, processor, or other programmable apparatus to cause a series of operations to be performed on the computer, processor, or other programmable apparatus to produce a computer-implemented process such that the instructions executed on the computer, processor, or other programmable apparatus provide operations for implementing the functions and/or operations specified in the flowchart blocks. The flowchart blocks support combinations of means for performing the specified operations and/or functions and combinations of operations and/or functions for performing the specified operations and/or functions. It will be understood that one or more blocks of the flowcharts, and combinations of blocks in the flowcharts, can be implemented by special purpose hardware-based computer systems which perform the specified operations and/or functions, or combinations of special purpose hardware with computer instructions.

While this specification contains many specific embodiments and implementation details, these should not be construed as limitations on the scope of any disclosures or of what may be claimed, but rather as descriptions of features specific to particular embodiments of particular disclosures. Certain features that are described herein in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

While operations and/or functions are illustrated in the drawings in a particular order, this should not be understood as requiring that such operations and/or functions be performed in the particular order shown or in sequential order, or that all illustrated operations be performed, to achieve desirable results. In certain circumstances, operations and/or functions in alternative ordering may be advantageous. In some cases, the actions recited in the claims may be performed in a different order and still achieve desirable results. Thus, while particular embodiments of the subject matter have been described, other embodiments are within the scope of the following claims.

While this detailed description has set forth some embodiments of the present invention, the appended claims cover other embodiments of the present invention which differ from the described embodiments according to various modifications and improvements.

Within the appended claims, unless the specific term "means for" or "step for" is used within a given claim, it is not intended that the claim be interpreted under 35 U.S.C. § 112, paragraph 6.

The invention claimed is:

1. An apparatus comprising:
a current generator circuitry comprising:
an op amp comprising a first input, a second input, and an output, wherein the first input is electrically connected to a reference voltage;
a first FET comprising a first drain, a first gate, and a first source, wherein the first gate is connected to the output of the op amp;
a resistor comprising a first terminal and a second terminal, wherein the first terminal is electrical connected to the first source and to the second input of the op amp, and wherein the second terminal is electrically connected to a ground;
a voltage supply;
a second FET comprising a second drain, a second gate, and a second source, wherein the second drain is electrically connected to a voltage source;
a third FET comprising a third drain, a third gate, and a third source, wherein the third drain is electrically connected to the voltage source, and wherein the third gate is electrically connected to the second gate, the second source, and to the first drain;
an output terminal of the current generator circuitry, wherein the output terminal of the current generator circuitry is electrically connected to the third source; and
an IDAC electrically connected to the output terminal of the current generator circuitry.

2. The apparatus of claim 1, wherein the IDAC is configured to generate an IDAC current based at least on a reference current generated by the current generator circuitry.

3. The apparatus of claim 2, wherein the current generator circuitry is configured to generate the reference current based on the resistor, and wherein a change in a resistance of the resistor based on a change in temperature is associated with a change in the reference current.

4. The apparatus of claim 2, wherein the IDAC is further configured to generate the IDAC current based on a selection signal comprising a plurality of bits.

5. The apparatus of claim 4, wherein the plurality of bits comprise 8 bits, and wherein the 8 bits specify to the IDAC a number of current increments to implement in the IDAC current.

6. The apparatus of claim 2 further comprising PWM circuitry configured to generate a driver signal based at least on the IDAC current.

7. The apparatus of claim 6 further comprising a SPAD array configured to be driven based at least on the driver signal.

8. The apparatus of claim 1, wherein the second FET and the third FET are PMOSFETs.

9. The apparatus of claim 1, wherein the first FET is an NMOSFET.

10. The apparatus of claim 1, wherein the apparatus is one of a mobile phone, laptop, or augmented reality device.

14

11. A method comprising:
generating a first reference current with a current generator circuitry, wherein the current generator circuitry comprises:
an op amp comprising a first input, a second input, and an output, wherein the first input is electrically connected to a reference voltage;
a first FET comprising a first drain, a first gate, and a first source, wherein the first gate is connected to the output of the op amp;
a resistor comprising a first terminal and a second terminal, wherein the first terminal is electrical connected to the first source and to the second input of the op amp, and wherein the second terminal is electrically connected to a ground;
a voltage supply;
a second FET comprising a second drain, a second gate, and a second source, wherein the second drain is electrically connected to a voltage source;
a third FET comprising a third drain, a third gate, and a third source, wherein the third drain is electrically connected to the voltage source, and wherein the third gate is electrically connected to the second gate, the second source, and to the first drain;
an output terminal of the current generator circuitry, wherein the output terminal of the current generator circuitry is electrically connected to the third source;
generating a first IDAC current with an IDAC at a first time based on the first reference current, wherein the IDAC is electrically connected to the output terminal of the current generator circuitry;
generating an adjusted reference current with the current generator circuitry at a second time based on a change in temperature;
generating an adjusted IDAC current with the IDAC at a second time based on the adjusted reference current.

12. The method of claim 11, wherein generating the first reference current is based on the resistor, and wherein generating the adjusted reference current is based on a change in temperature associated with a change in the first reference current.

13. The method of claim 11, wherein generating the first IDAC current is based on a selection signal comprising a plurality of bits, and wherein generating the adjusted IDAC current is based on the selection signal.

14. The method of claim 13, wherein the plurality of bits comprise 8 bits, and wherein the 8 bits specify to the IDAC a plurality of current increments to implement in the ajusted IDAC current.

15. The method of claim 14, each voltage increment of the plurality of current increments is associated with a linear current change.

16. The method of claim 11 further comprising generating a driver signal with a PWM circuitry based at least on the adjusted IDAC current.

17. The method of claim 16, further comprising driving a SPAD array with the driver signal.

18. The method of claim 11, wherein the second FET and the third FET are PMOSFETs.

19. The method of claim 11, wherein the first PET is an NMOSFET.

20. The method of claim 11, wherein the current generator circuitry and the IDAC are in one of a mobile phone, laptop, or augmented reality device.

* * * * *